US012651099B2

(12) United States Patent
Okabe et al.

(10) Patent No.: US 12,651,099 B2
(45) Date of Patent: Jun. 9, 2026

(54) DEVELOPMENT SUPPORT DEVICE, DEVELOPMENT SUPPORT METHOD, AND COMPUTER PROGRAM

(71) Applicant: GS Yuasa International Ltd., Kyoto (JP)

(72) Inventors: Yosuke Okabe, Kyoto (JP); Shigeki Yamate, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 925 days.

(21) Appl. No.: 17/598,727

(22) PCT Filed: Mar. 25, 2020

(86) PCT No.: PCT/JP2020/013248
§ 371 (c)(1),
(2) Date: Sep. 27, 2021

(87) PCT Pub. No.: WO2020/196596
PCT Pub. Date: Oct. 1, 2020

(65) Prior Publication Data
US 2022/0188481 A1    Jun. 16, 2022

(30) Foreign Application Priority Data

Mar. 28, 2019    (JP) ................................. 2019-064218
Mar. 18, 2020    (JP) ................................. 2020-048369

(51) Int. Cl.
*G06F 30/20*    (2020.01)
*H01M 10/42*    (2006.01)
*H01M 10/48*    (2006.01)

(52) U.S. Cl.
CPC ............ *G06F 30/20* (2020.01); *H01M 10/42* (2013.01); *H01M 10/48* (2013.01)

(58) Field of Classification Search
CPC ........ G06F 30/20; H01M 10/42; H01M 10/48
See application file for complete search history.

(56) References Cited

U.S. PATENT DOCUMENTS

2006/0155760 A1    7/2006  Takahashi et al.
2010/0007481 A1*   1/2010  Uchida ................... B60L 53/65
                                                      340/455

(Continued)

FOREIGN PATENT DOCUMENTS

JP        H11-0014507 A      1/1999
JP        2004-220600 A      8/2004

(Continued)

OTHER PUBLICATIONS

Extended European Search Report issued Sep. 23, 2022 for European Patent Application No. 20777965.3-1108.

(Continued)

*Primary Examiner* — Chuen-Meei Gan
(74) *Attorney, Agent, or Firm* — McGinn IP Law Group, PLLC

(57)    ABSTRACT

A development support device includes a receiver that receives selection information about a degradation mechanism of a power storage device from a terminal device after user authentication of the terminal device, a simulation execution unit that simulates degradation of the power storage device by using the selected degradation mechanism based on the received selection information, and a transmitter that transmits a simulation result by the simulation execution unit or a simulation program executed in simulating the degradation of the power storage device to the terminal device.

18 Claims, 9 Drawing Sheets

(56)               References Cited

U.S. PATENT DOCUMENTS

| | | |
|---|---|---|
| 2014/0103934 A1 | 4/2014 | Matsui et al. |
| 2014/0312915 A1 | 10/2014 | Mukaitani et al. |
| 2017/0205469 A1* | 7/2017 | Song .................... G01R 31/392 |
| 2018/0088181 A1 | 3/2018 | Jiang et al. |
| 2018/0115024 A1 | 4/2018 | Sugeno et al. |
| 2018/0143257 A1* | 5/2018 | Garcia ................. G01R 31/382 |

FOREIGN PATENT DOCUMENTS

| | | | |
|---|---|---|---|
| JP | 2014-077785 A | 5/2014 | |
| JP | 2015-050062 A | 3/2015 | |
| JP | 2015-215169 A | 12/2015 | |
| JP | WO 2017/002292 A1 * | 1/2017 | ............... H02J 7/10 |
| JP | 2017-139857 A | 8/2017 | |
| WO | WO 2014/132332 A1 | 9/2014 | |
| WO | WO 2014/155726 A1 | 10/2014 | |
| WO | WO 2017/002292 A1 | 1/2017 | |
| WO | WO 2018/147194 A1 | 8/2018 | |

OTHER PUBLICATIONS

International Search Report (ISR) (PCT Form PCT/ISA/210), in PCT/JP2020/013248, dated Jun. 30, 2020.

* cited by examiner

Fig. 3

| Battery ID | User ID | Positive electrode | | | | | Negative electrode | | | | | |
| | | Material | Thickness | Width | Depth | OCP | Material | Thickness | Width | Depth | OCP | |
| c001 | u001 | LMO | Zp | Xp | Yp | ☑ | | Zn | Xn | Yn | ☑ | ⋮ |
| ⋯ | ⋯ | ⋯ | ⋯ | ⋯ | ⋯ | ⋯ | ⋯ | ⋯ | ⋯ | ⋯ | ⋯ | ⋮ |

Lithium ion concentration in electrolyte solution

DEVELOPMENT SUPPORT DEVICE, DEVELOPMENT SUPPORT METHOD, AND COMPUTER PROGRAM

TECHNICAL FIELD

The present invention relates to a development support device, a development support method, and a computer program that are implemented in a computer.

BACKGROUND ART

In recent years, model-based development (MBD) has been actively introduced and product development based on simulation has permeated among various industries including the automobile industry (for example, see Patent Document 1).

PRIOR ART DOCUMENTS

Patent Document

Patent Document 1: JP-A-11-14507

SUMMARY OF THE INVENTION

Problems to be Solved by the Invention

It is important for companies such as automobile manufacturers and power storage system manufacturers that purchase and assemble a battery, to be able to predict degradation of the battery that is one of development factors in view of such as strength design of a battery housing, life cycle design, cooling device design, and maintenance management. However, it is difficult for a person other than an expert to grasp the degradation behavior of a battery.

A production amount of elements used for an electrode of a battery is small, and it is considered that reuse will proceed in the future. However, the reuse may be difficult depending on a degradation state. It is important to grasp the degradation behavior based on a degradation mechanism in order to grasp a recovery rate and perform appropriate recycling.

An object of the present invention is to provide a development support device, a development support method, and a computer program that are capable of providing a result of a degradation simulation of a power storage device or a simulation program in consideration of the degradation mechanism to a user through a network.

Means for Solving the Problems

According to one aspect of the present invention, a development support device includes: a receiver that receives selection information about a degradation mechanism of a power storage device from a terminal device after user authentication of the terminal device; a simulation execution unit that simulates degradation of the power storage device by using the selected degradation mechanism based on the received selection information; and a transmitter that transmits a simulation result by the simulation execution unit or a simulation program executed in simulating the degradation of the power storage device to the terminal device.

According to another aspect of the present invention, a development support method using a development support device communicably connected to a terminal device, the development support method includes: presenting a plurality of options regarding a degradation mechanism of a power storage device, and receiving selection information about a selected degradation mechanism from the terminal device; simulating degradation of the power storage device using the selected degradation mechanism based on the received selection information; and transmitting a simulation result or a simulation program executed in simulating the degradation of the power storage device to the terminal device.

According to still another aspect of the present invention, a computer program for causing a computer to execute processing of presenting a plurality of options regarding a degradation mechanism of a power storage device, and accepting selection regarding the degradation mechanism of the power storage device based on the presented option; simulating degradation of the power storage device using the selected degradation mechanism; and outputting a simulation result or a simulation program executed in simulating the degradation of the power storage device to the terminal device.

Advantages of the Invention

According to the above configuration, the result of the degradation simulation of the power storage device in consideration of the degradation mechanism can be provided to the user through the network.

BRIEF DESCRIPTION OF THE DRAWINGS

FIG. 3 is a conceptual diagram illustrating an example of a battery table.

MODE FOR CARRYING OUT THE INVENTION

Figure 1:
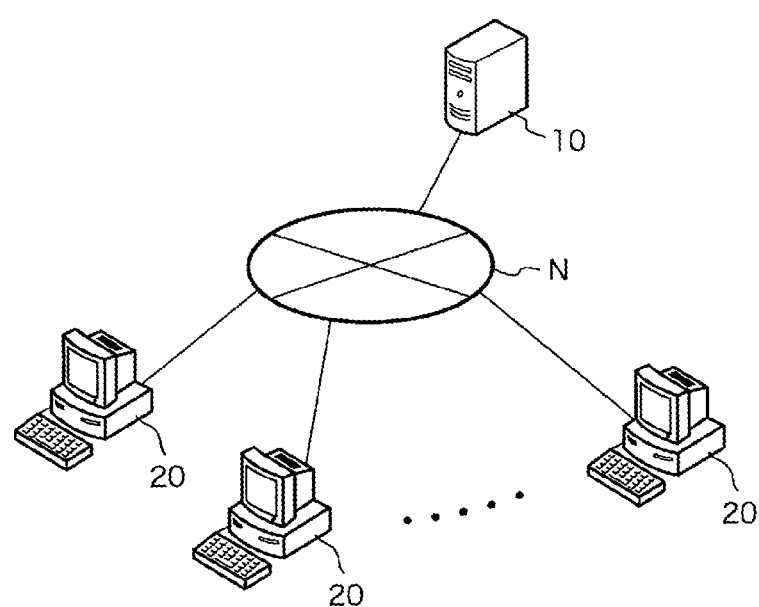
FIG. 1 is a block diagram illustrating an overall configuration of a simulation system of an embodiment.

A development support device includes a receiver that receives selection information about a degradation mechanism of a power storage device from a terminal device after user authentication of the terminal device, a simulation execution unit that simulates degradation of the power storage device by using the selected degradation mechanism based on the received selection information, and a transmitter that transmits a simulation result by the simulation execution unit or a simulation program executed in simulating the degradation of the power storage device to the terminal device.

Consequently, even when the user is not familiar with the degradation mechanism of the power storage device, the development support device can provide the result of the degradation simulation of the power storage device to the user only by receiving the selection information about the degradation mechanism. The user can grasp a life cycle prediction of the product, a replacement timing prediction, a recovery rate prediction for a purpose of reuse, a calorific value, and the like based on the provided result of the degradation simulation. The development support device may provide the simulation program executed in simulating the degradation of the power storage device. The user can acquire the result of the degradation simulation of the power storage device by executing the simulation program in the terminal device.

The simulation execution unit may execute the simulation using a physical model representing the power storage device. According to this configuration, the simulation result accurately reflecting the physical phenomenon inside the power storage device can be obtained because the simulation is executed using the physical model of the power storage device.

The degradation mechanism may include at least one of an increase in electric resistance in each element constituting the power storage device, isolation of an active material particle (meaning of isolation will be described later), a decrease in conductivity in an electrolyte solution, and a decrease in charge carrier involved in charge and discharge. According to this configuration, the degradation of the power storage device can be simulated using the increase in electric resistance in each element, the isolation of the active material particle, the decrease in conductivity in the electrolyte solution, and the decrease in charge carriers as the degradation mechanism. In the specification, the active material particle refers to a secondary particle in which primary particles are aggregated, a particle composed of only primary particles, or the like. The active material is a material that exchanges electrons, and a typical active material of a lithium-ion battery is a lithium-metal composite oxide or a carbon material. In the specification, the charge carrier refers to a carrier of a charge existing in a solid phase or a liquid phase, and for example, is a lithium-ion $Li^+$ in the case of the lithium-ion battery.

The increase in electric resistance may include an increase in electric resistance at an adhesion portion between current collecting foil and a porous electrode, an increase in electric resistance associated with a decrease in conductive path in the active material particles, or an increase in electric resistance associated with an increase in resistance film on a particle surface. According to this configuration, the degradation of the power storage device can be simulated in consideration of the increase in electric resistance at the adhesion portion between the current collecting foil and the porous electrode, the increase in electric resistance associated with the decrease in conductive path in the active material particle, or the increase in electric resistance associated with the increase in the resistance film on the particle surface.

The increase in the electric resistance, the isolation of the active material particle, and the decrease in conductivity are represented by a function of an upper limit and a lower limit of the SOC during discharge. According to this configuration, the degradation of the power storage device can be simulated in consideration of the use status of the device on which the power storage device is mounted. The SOC is an abbreviation of state of charge, and a full charge state is represented as 100% and a full discharge state is represented as 0%.

The increase in electric resistance, the isolation of the active material particle, the decrease in conductivity, and the decrease in charge carrier may be represented by a function of at least one of elapsed time, a cycle number, and a temperature. According to this configuration, the degradation of the power storage device can be presented as the function of the elapsed time, the cycle number, or the temperature. In the specification, the cycle number represents the number of times of the charge and discharge.

The decrease in charge carrier may be represented by a stoichiometric coefficient of a charge transfer process on a surface of a negative electrode during charge. According to this configuration, the decrease in charge carrier can be represented by the stoichiometric coefficient.

The simulation result may include a time change or a cycle change of any one of a value of electric resistance, a volume ratio of an isolated region of the active material particle, a diffusion coefficient or ionic conductivity of the electrolyte solution, a charge carrier amount, and an expansion coefficient of the power storage device in each element constituting the power storage device. According to this configuration, the value of the electric resistance, the volume ratio of the isolated region of the active material particle, the diffusion coefficient or the ionic conductivity of the electrolyte solution, the charge carrier amount, and the expansion coefficient of the power storage device can be presented as the function of the elapsed time or the cycle number.

A development support device includes a reception unit that receives selection information about a degradation mechanism of a power storage device, a simulation execution unit that simulates degradation of the power storage device using the selected degradation mechanism based on the received selection information, and an output unit that outputs a simulation result by the simulation execution unit or a simulation program executed when degradation of the power storage device is simulated. According to this configuration, even when the user is not familiar with the degradation mechanism of the power storage device, the development support device can provide the result of the degradation simulation of the power storage device to the user only by receiving the selection information about the degradation mechanism. According to the above configuration, because the development support device can provide the simulation program to the user, the user can acquire the result of the degradation simulation of the power storage device by executing the simulation program using the terminal device.

A development support method using a development support device communicably connected to a terminal device, the development support method includes presenting a plurality of options regarding a degradation mechanism of a power storage device, and receiving selection information about a selected degradation mechanism from the terminal device, simulating degradation of the power storage device using the selected degradation mechanism based on the received selection information, and transmitting a simulation result or a simulation program executed in simulating the degradation of the power storage device to the terminal device. According to this configuration, even when the user is not familiar with the degradation mechanism of the power storage device, the development support device can provide the result of the degradation simulation of the power storage device to the user only by receiving the selection information about the degradation mechanism. According to the above configuration, because the development support device can provide the simulation program to the user, the user can acquire the result of the degradation simulation of the power storage device by executing the simulation program using the terminal device.

A development support method using a computer, the development support method includes: presenting a plurality of options regarding a degradation mechanism of a power storage device; accepting a selection regarding the degradation mechanism of the power storage device based on the presented option; simulating degradation of the power storage device using the selected degradation mechanism; and outputting a simulation result or a simulation program executed in simulating the degradation of the power storage device. According to this configuration, even when the user is not familiar with the degradation mechanism of the power storage device, the development support device can provide the result of the degradation simulation of the power storage device to the user only by receiving the selection information about the degradation mechanism. According to the above configuration, because the development support device can provide the simulation program to the user, the user can acquire the result of the degradation simulation of the power storage device by executing the simulation program using the terminal device.

A computer program for causing a computer to execute processing of presenting a plurality of options regarding a degradation mechanism of a power storage device, and receiving selection information about the selected degradation mechanism from a terminal device, simulating degradation of the power storage device using the selected degradation mechanism based on the received selection information, and transmitting a simulation result or a simulation program executed in simulating the degradation of the power storage device to the terminal device. According to this configuration, even when the user is not familiar with the degradation mechanism of the power storage device, the development support device can provide the result of the degradation simulation of the power storage device to the user only by receiving the selection information about the degradation mechanism. According to the above configuration, because the development support device can provide the simulation program to the user, the user can acquire the result of the degradation simulation of the power storage device by executing the simulation program using the terminal device.

A computer program for causing a computer to execute processing of presenting a plurality of options regarding a degradation mechanism of a power storage device; accepting a selection regarding the degradation mechanism of the power storage device based on the presented option; simulate degradation of the power storage device using the selected degradation mechanism; and outputting a simulation result or a simulation program executed in simulating the degradation of the power storage device. According to this configuration, even when the user is not familiar with the degradation mechanism of the power storage device, the development support device can provide the result of the degradation simulation of the power storage device to the user only by receiving the selection information about the degradation mechanism. According to the above configuration, because the development support device can provide the simulation program to the user, the user can acquire the result of the degradation simulation of the power storage device by executing the simulation program using the terminal device.

A computer program for causing a computer to execute the processing of presenting a plurality of options regarding a degradation mechanism of a power storage device, accepting selection regarding the degradation mechanism of the power storage device based on the presented option, and transmitting selection information about the degradation mechanism to the server device in order to cause the server device to simulate degradation of the power storage device using the selected degradation mechanism. According to this configuration, the selection information about the degradation mechanism is transmitted to the server device that simulates the degradation of the power storage device based on the degradation mechanism, so that the simulation result can be obtained based on the selected degradation mechanism.

The simulation program provided to the user may include not only a calculation program for calculating degradation but also a calculation program based on an electrochemical model to be described later.

Hereinafter, the present invention will be specifically described based on the drawings illustrating an embodiment.

FIG. 1 is a block diagram illustrating an overall configuration of a simulation system of the embodiment. The simulation system of the embodiment includes a server device 10 and a client device 20 communicably connected to each other through a communication network N. In response to a request from the client device 20, the server device 10 simulates degradation of the power storage device and provides a simulation result to the client device 20. At this point, for example, the degradation of the power storage device represents an event in which, when the power storage device is repeatedly used, the charge-discharge capacity decreases and the discharge does not last long. The degradation is classified into aging degradation generated only with elapse of time and cycle degradation generated according to the number of times of use (the number of times of the charge and discharge).

In the embodiment, the power storage device to be simulated is a wound type lithium ion battery in which an electrolyte is a liquid. Alternatively, the power storage device to be simulated may be any battery such as a laminate type lithium ion battery, a lithium ion battery in which an electrolyte is an ionic liquid, a lithium ion battery in which an electrolyte is a gel, an all-solid lithium ion battery, a bipolar type lithium ion battery (in which electrodes are electrically connected in series), a zinc-air battery, a sodium ion battery, or a lead-acid battery. The power storage device may include a module in which a plurality of cells are connected in series, a bank in which a plurality of modules are connected in series, and a domain in which a plurality of banks are connected in parallel. In the following description, the power storage device is also simply referred to as a battery.

The client device 20 is a terminal device such as a personal computer, a smartphone, or a tablet terminal used by a user. In the client device 20, software (application program) is installed to access the server device 10. The server device 10 performs user authentication based on, for example, a user ID and a password when receiving access from the client device 20, and provides an appropriate service to the client device 20 when the user authentication is successful. The user may be an engineer of a manufacturer that designs a product of the power storage device, or may be an end user who uses a product on which the power storage device is mounted.

After user authentication, the server device 10 of the embodiment transmits an interface screen 100 (see FIG. 5) to the client device 20 in order to receive various inputs by the user of the client device 20. The interface screen 100 is configured to accept conditions necessary for simulating the degradation of the power storage device. Details of the interface screen 100 will be described later. The server device 10 executes the simulation based on the condition accepted through the interface screen 100, and transmits a simulation result that is an execution result to the client device 20. The simulation result transmitted from the server device 10 to the client device 20 includes data such as numerical data, a graph, and the like obtained as the simulation execution result. The simulation result transmitted from the server device 10 to the client device 20 may include a mathematical model obtained as the simulation execution result or may include a simulation model. The mathematical model or the simulation model provided by the server device 10 may be provided while being able to be edited by the user. In this case, the user can change the parameter (for example, a coefficient regarding the ionic conductivity and a degradation rate of the electrolyte solution described later) in the mathematical model or the simulation model, and execute the simulation using the changed mathematical model or the simulation model. Alternatively, according to the intention of the provider, the mathematical model or the simulation model may be provided in an uneditable state or some parameters may be provided in an editable state.

Figure 5:
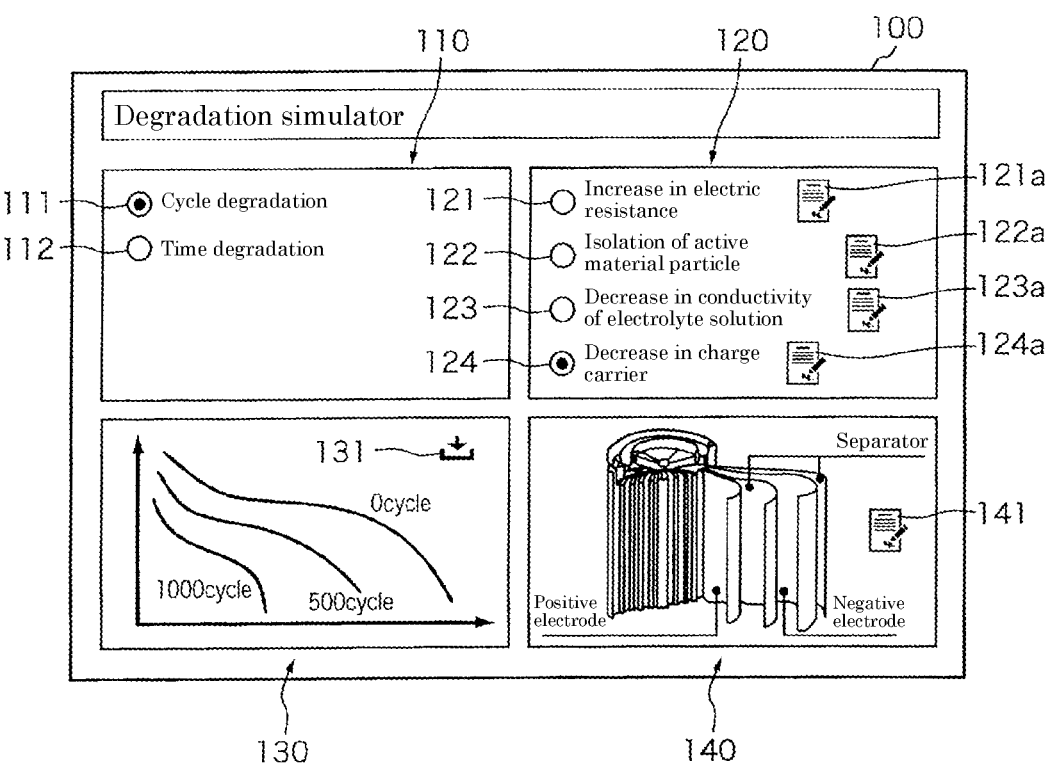
FIG. 5 is a schematic diagram illustrating an example of an interface screen.

Alternatively, the client device 20 may have an application program displaying the interface screen 100 as illustrated in FIG. 5. The client device 20 may accept a condition necessary for simulating the degradation of the power storage device through the interface screen 100 displayed by executing the application program, and transmit the received condition to the server device 10.

Figure 2:
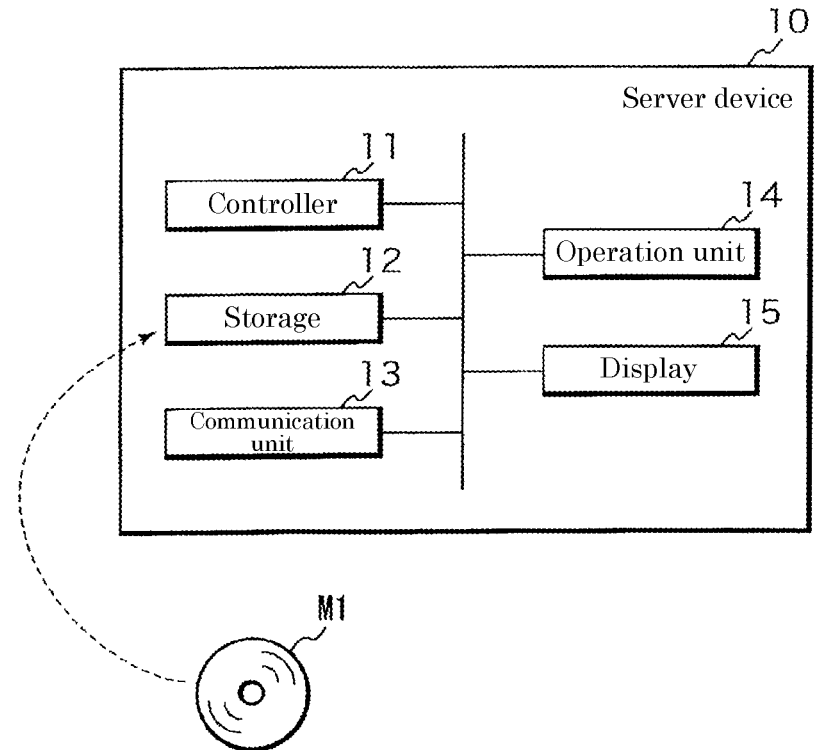
FIG. 2 is a block diagram illustrating an internal configuration of a server device.

FIG. 2 is a block diagram illustrating an internal configuration of the server device 10. The server device 10 includes a controller 11, a storage 12, a communication unit 13, an operation unit 14, and a display 15.

The controller 11 includes a central processing unit (CPU), a read only memory (ROM), and a random access memory (RAM). The CPU included in the controller 11 causes the entire device to function as the development support device of the present application by developing various computer programs stored in the ROM or the storage 12 on the RAM to execute the computer programs. The server device 10 is merely the embodiment of the development support device, and may be any information processing device communicably connected to client device 20.

The controller 11 is not limited to the above configuration, but may be any processing circuit or arithmetic circuit including a plurality of CPUs, multi-core CPUs, graphics processing units (GPUs), microcomputers, or volatile or nonvolatile memories. The controller 11 may have functions such as a timer that measures the elapsed time from when a measurement start instruction is given to when a measurement end instruction is given, a counter that counts a number, and a clock that outputs date and time information.

The storage 12 includes a storage device using a hard disk drive (HDD), a solid-state drive (SSD), or the like. The storage 12 stores various computer programs executed by the controller 11, data necessary for executing the computer programs, and the like. The computer program stored in the storage 12 includes a simulation program simulating the behavior of the power storage device. For example, the simulation program is an execution binary. A theoretical equation that is a source of the simulation program is described by an algebraic equation or a differential equation representing the degradation mechanism of the power storage device. The simulation program may be prepared for each degradation mechanism, or prepared as one computer program. The simulation program may be described by a commercially available numerical analysis software or programming language such as MATLAB (registered trademark), Amesim (registered trademark), Twin Builder (registered trademark), MATLAB & Simulink (registered trademark), Simplorer (registered trademark), ANSYS (registered trademark), Abaqus (registered trademark), Modelica (registered trademark), VHDL-AMS (registered trademark), C language, C++, or Java (registered trademark). The numerical analysis software may be a circuit simulator called 1D-CAE, or may be a simulator such as a finite element method or a finite volume method performed in a 3D shape. Alternatively, a reduced-order model (ROM) based on these may be used.

The program stored in the storage 12 may be provided by a non-transitory recording medium M1 in which the program is readably recorded. For example, the recording medium M1 is a portable memory such as a CD-ROM, a universal serial bus (USB) memory, a secure digital (SD) card, a micro-SD card, and a compact flash (registered trademark). In this case, the controller 11 reads the program from the recording medium M1 using a reading device (not illustrated), and installs the read program in the storage 12. The program stored in the storage 12 may be provided by communication through the communication unit 13. In this case, the controller 11 acquires the program through the communication unit 13 and installs the acquired program in the storage 12.

The storage 12 may store a mathematical model obtained as a result of the simulation. For example, the mathematical model is an execution code executed by a programming language or numerical analysis software. The mathematical model may be definition information, or a library file referred to by the programming language or the numerical analysis software.

The storage 12 may have a battery table that stores information of the power storage device (also simply referred to as the battery) in association with a user ID. FIG. 3 is a conceptual diagram illustrating an example of the battery table. For example, the battery table stores a battery ID identifying the battery, the user ID identifying the user, and battery information in association with each other. For example, the battery information registered in the battery table includes information about a positive electrode and a negative electrode, information about the electrolyte solution, and information about a tab. The information about the positive electrode and the negative electrode is information such as material names, thicknesses, widths, depths, and open circuit potentials of the positive electrode and the negative electrode. The information about the electrolyte solution and the tab is information such as ion species, transport number, diffusion coefficient, and conductivity. The battery table may include a link that refers to information such as physical properties, an operation state, and a circuit configuration of the power storage device. The information stored in the battery table may be registered by an administrator of the server device 10 or registered by the user through the client device 20. The information stored in the battery table is used as a part of simulation conditions when the degradation of the power storage device is simulated.

The communication unit 13 includes an interface communicating with the client device 20 through the communication network N. When information to be transmitted to the client device 20 is input from the controller 11, the communication unit 13 transmits the input information to the client device 20 and outputs the information from the client device 20 received through the communication network N to the controller 11.

The operation unit 14 includes an input interface such as a keyboard and a mouse, and receives the operation by the user. The display 15 includes a liquid crystal display device, and displays information to be reported to the user. In the embodiment, the server device 10 includes the operation unit 14 and the display 15. However, the operation unit 14 and the display 15 are not essential, but may be configured to receive the operation through a computer connected to the outside of the server device 10 and output the information to be reported to the external computer.

Figure 4:
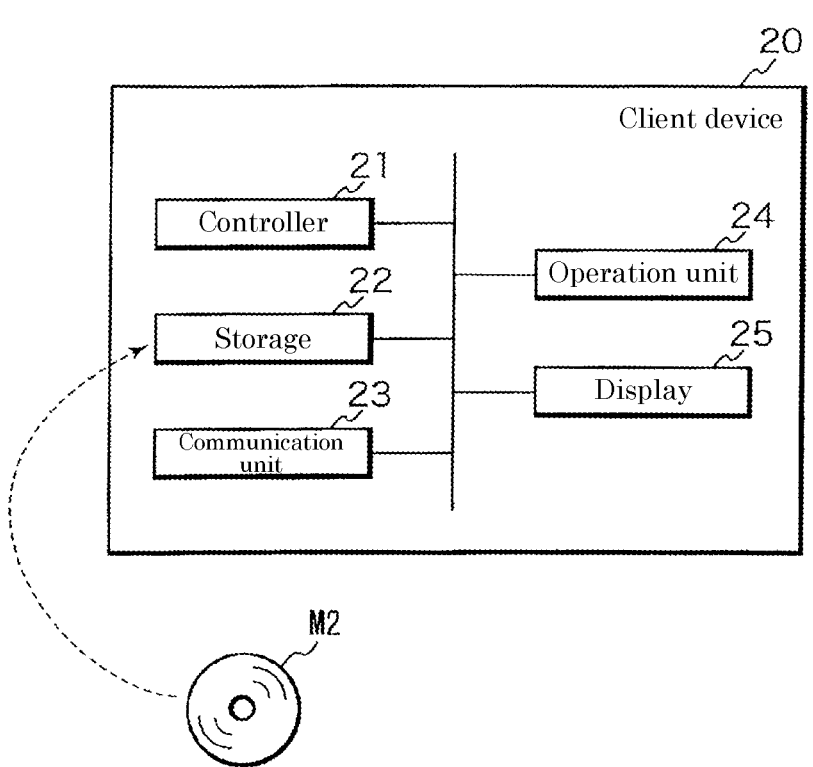
FIG. 4 is a block diagram illustrating an internal configuration of a client device.

FIG. 4 is a block diagram illustrating an internal configuration of the client device 20. The client device 20 is a personal computer, a smartphone, a tablet terminal, or the like, and includes a controller 21, a storage 22, a communication unit 23, an operation unit 24, and a display 25.

The controller 21 includes a CPU, a ROM, and a RAM. The CPU included in the controller 21 causes the entire device to function as the terminal device of the present application by developing various computer programs stored in the ROM or the storage 22 on the RAM and executing the programs.

The controller 21 is not limited to the above configuration, but may be any processing circuit or arithmetic circuit including a plurality of CPUs, multi-core CPUs, and micro-computers. The controller 21 may have functions such as a timer that measures the elapsed time from when the measurement start instruction is given to when the measurement end instruction is given, a counter that counts the number, and a clock that outputs the date and time information.

The storage 22 includes a nonvolatile memory such as an electronically erasable programmable read-only memory (EEPROM), and stores various computer programs and data. The computer program stored in the storage 22 includes a dedicated or general-purpose application used for exchanging information with the server device 10. An example of the dedicated application program is a computer program causing the client device 20 to execute processing of presenting a plurality of options regarding the degradation mechanism of the power storage device to the user, receiving a selection regarding the degradation mechanism of the power storage device, and transmitting selection information of the degradation mechanism to the server device 10 in order to cause the server device 10 to simulate the degradation of the power storage device using the selected degradation mechanism. An example of the general-purpose application program is a web browser. When the server device 10 is accessed using the web browser, preferable the user authentication is performed using the user ID and the authentication code, and communication between the server device 10 and the client device 20 may be permitted only when the user authentication is successful.

The program stored in the storage 22 may be provided by a non-transitory recording medium M2 in which the program is readably recorded. For example, the recording medium M2 is a portable memory such as a CD-ROM, a USB memory, an SD card, a micro-SD card, and a compact flash (registered trademark). In this case, the controller 21 reads the program from the recording medium M2 using a reading device (not illustrated), and installs the read program in the storage 22. The program stored in the storage 22 may be provided by communication through the communication unit 23. In this case, the controller 21 acquires various programs through the communication unit 23, and installs the acquired various programs in the storage 22.

The communication unit 23 includes an interface communicating with the server device 10 through the communication network N. When the information to be transmitted to the server device 10 is input from the controller 21, the communication unit 23 transmits the input information to the server device 10 and outputs the information from the server device 10 received through the communication network N to the controller 21.

The operation unit 24 includes an input interface such as a keyboard, a mouse, and a touch panel, and receives the operation by the user. The display 25 includes a liquid crystal display device, and displays the information to be reported to the user. In the embodiment, the client device 20 includes the operation unit 24, but an input interface such as a keyboard or a mouse may be connected to the client device 20.

With reference to the interface screen 100 displayed on the display 25 of the client device 20, the operation of the simulation system of the embodiment will be described below.

FIG. 5 is a schematic diagram illustrating an example of the interface screen 100. The interface screen 100 in FIG. 5 illustrates an example of a screen displayed on the display 25 of the client device 20 after the client device 20 accesses the server device 10 to be authenticated as a valid user. When the client device 20 communicates with the server device 10 to acquire data for the display screen from the server device 10, which allows the client device 20 to display the interface screen 100 in FIG. 5 on the display 25.

The interface screen 100 is a screen including various display fields and operation buttons arranged as components of a user interface (UI), and is configured to receive the operation by the user through the operation unit 24.

The interface screen 100 illustrated in FIG. 5 as an example includes a selection field 110 receiving selection of the cycle degradation or the time degradation, a selection field 120 receiving selection of the degradation mechanism, a display field 130 displaying a calculation process during the simulation, and an input field 140 receiving input of battery information.

The selection field 110 includes a radio button 111 selected in giving a simulation execution instruction for the cycle degradation and a radio button 112 selected in giving a simulation execution instruction for the time degradation. The example in FIG. 5 illustrates a state in which the radio button 111 instructing the simulation of the cycle degradation is selected. Alternatively, the radio button 112 may be selected, and both the radio buttons 111,112 may be selected.

The selection field 120 includes a radio button 121 to 124 selected when an increase in electric resistance, isolation of active material particle, a decrease in conductivity of the electrolyte solution, and a decrease in charge carriers are designated as the degradation mechanisms of the power storage device. The example in FIG. 5 illustrates the state in which the radio button 124 designating the decrease of the charge carriers is selected as the degradation mechanism. Alternatively, any one of the radio buttons 121 to 123 may be selected, and at least two of the radio buttons 121 to 124 may be selected. In the selection field 120, edit buttons 121a to 124a are arranged corresponding to the radio buttons 121 to 124. When the edit buttons 121a to 124a are operated, a setting screen receiving setting changes of various parameters is displayed for the corresponding degradation mechanism.

A calculation process during the simulation is displayed in the display field 130. In the example of FIG. 5, the calculation process in the case where the cycle degradation and the time degradation are simulated for the decrease in charge carriers is illustrated by a graph. Alternatively, the numerical data indicating the calculation process may be displayed. In the display field 130, a download button 131 is disposed, and a simulation result can be downloaded. The simulation result may be the graph or the numerical data. Alternatively, the simulation result may be provided by a mathematical model. At this point, the mathematical model represents a model in which a degradation process of the power storage device is mathematically described using an algebraic equation, a differential equation, and a characteristic parameter, and is a model obtained by executing the simulation. For example, the mathematical model is provided by a format of a library, a module, or the like used in commercially available numerical analysis software such as MATLAB (registered trademark), Amesim (registered trademark), Twin Builder (registered trademark), MATLAB & Simulink (registered trademark), Simplorer (registered trademark), ANSYS (registered trademark), Abaqus (registered trademark), Modelica (registered trademark), VHDL-AMS (registered trademark), C language, C++, or Java (registered trademark) or a programming language.

An edit button 141 editing information (battery information) on the power storage device is disposed in the input field 140. When the edit button 141 is operated using the operation unit 24, the client device 20 causes the display 25 to display a reception screen receiving the battery information. When the reception of the battery information is completed, the client device 20 transmits the received battery information to the server device 10. The server device 10 registers the battery information received from the client device 20 in the battery table of the storage 12.

In the example of FIG. 5, the battery information is received through the input field 140. Alternatively, the battery information may be previously prepared for each type and model number of the power storage device, and the battery information may be automatically set by receiving the selection for the type and model number of the power storage device.

When various conditions are set through the interface screen displayed on the display 25 of the client device 20, the simulation of the degradation of the power storage device is started in the server device 10. The server device 10 of the embodiment executes the simulation of the degradation using a physical model of the battery. The physical model is a model representing a first-principle model and expressing a phenomenon inside the power storage device by a mathematical expression or the like according to an established natural phenomenon (physical law or chemical law). The physical model is also referred to as a white box. Because it is considered for those skilled in the art that the degradation mechanism of the power storage device is difficult to be expressed by the physical model, the degradation simulation using the physical model has not been performed so far.

An example of the physical model will be described below.

The physical model used for the degradation simulation is a physical model represented by a Newman model. The Newman model assumes that homogeneous single diameter spheres are arranged close to each other in each of the positive electrode and the negative electrode. The Newman model is described by a Nernst-Planck equation, a charge conservation equation, a diffusion equation, a Butler-Volmer equation, and a Nernst equation described below.

The Nernst-Planck equation is an equation solving ion migration and ion diffusion in an electrolyte or a porous electrode, and is expressed by the following equation.

$$i_l = -\sigma_{l,eff} \nabla \phi_l + \qquad \text{[Mathematical formula 1]}$$
$$\frac{\sigma_{l,eff} RT}{F}\left(1 + \frac{\partial \ln f}{\partial \ln c_l}\right)(1 - t_+)\nabla \ln c_l$$
$$\nabla \cdot i_l = i_{tot}$$

Here, it represents a liquid phase current density ($A/m^2$), $\sigma_{l,eff}$ represent a liquid phase effective conductivity (S/m), $\varphi_l$ represents a liquid phase potential (V), R represents a gas constant (J/(K mol)), T represents a temperature (K), F represents a Faraday constant (C/mol), f represents an activity coefficient, $c_l$ represents an ion concentration of the electrolyte ($mol/m^3$), $t_+$ represents a cation transport number, and $i_{tot}$ represents a reaction current density per volume ($A/m^3$). The liquid phase effective conductivity $\sigma_{l,eff}$ is apparent conductivity in a porous body, and is often expressed as a function of the conductivity of the liquid phase bulk and the solid phase volume ratio $\varepsilon_s$.

The charge conservation equation is an equation representing electron conduction in active material particles or current collecting foil, and is represented by the following equations.

$$i_s = -\sigma_s \nabla \phi_s$$

$$\nabla \cdot i_s = i_{tot} \qquad \text{[Mathematical formula 2]}$$

Here, $i_s$ represents a solid phase current density ($A/m^2$), $\varphi_s$ represents a solid phase potential (v), $\sigma_s$ represents a solid phase conductivity (S/m), and $i_{tot}$ represents a reaction current density per volume ($A/m^3$).

The diffusion equation is an equation representing the diffusion of the active material in the active material particles, and is expressed by the following equation.

$$\frac{\partial c_s}{\partial t} = \nabla \cdot (D_s \nabla c_s) \qquad \text{[Mathematical formula 3]}$$

Here, $c_s$ represents a charge carrier concentration ($mol/m^3$) in the solid phase, t represents time (s), and $D_s$ represents a diffusion coefficient ($m^2/s$) in the solid phase.

The Butler-Volmer equation is an equation representing an activation overvoltage in a charge transfer reaction generated at an interface between the solid phase and the liquid phase, and the Nernst equation is a definition formula of an open circuit potential, and each is represented by the following equations.

$$i_{loc} = i_0\left[\exp\left(\frac{\alpha_a F \eta}{RT}\right) - \exp\left(-\frac{\alpha_c F \eta}{RT}\right)\right] \qquad \text{[Mathematical formula 4]}$$
$$\eta = \phi_s - \phi_l - E_{eq}$$

-continued $$E_{eq} = E^0 + \frac{RT}{zF} \ln\left(\frac{a_{0x}}{a_{Red}}\right)$$

Here, $i_{loc}$ is a reaction current density (A/m²), $i_o$ is an exchange current density (A/m²), $\alpha_a$, $\alpha_c$ are transition coefficients of an oxidation reaction and a reductive reaction, $\eta$ is an activation overvoltage (V), $E_{eq}$ is an equilibrium potential (V), $E^0$ is a standard equilibrium potential (V), z is a valence, $a_{Ox}$ is an oxidant concentration (mol/m³), and $a_{Red}$ is a reductant concentration (mol/m³). An equation modified based on experimental values is alternatively often used as the Butler-Volmer equation and the Nernst equation. For example, the exchange current density may be a function of the charge carrier concentration or the ion concentration, or actual measurement data of the SOC and the open circuit potential may be used as the open circuit potential. In particular, in the lithium-ion secondary battery, the actual measurement data of the SOC and the open circuit potential is often used, and thus, will be described later. Each parameter in the above-described mathematical formula 1 to mathematical formula 4 may be a function of another physical value.

The relational expression between the charge carrier concentration in the solid phase and the charge carrier flux regarding the charge transfer reaction on the surface of the active material particle is illustrated in mathematical formula 5. $r_0$ represents a radius (m) of the active material particle, and $J_s$ represents a flux (mol/m²s) of the charge carrier. In other words, $J_s$ is the amount of charge carriers per unit area unit time that are disappeared and generated by the charge transfer reaction.

$$D_s \frac{\partial c_s}{\partial r}\bigg|_{r=r_0} = J_s \qquad \text{[Mathematical formula 5]}$$

Mathematical formula 6 is an equation representing the relationship between the flux $J_s$ of the charge carrier and the reaction current density $i_{loc}$.

$$i_{loc} = zFJ_s \qquad \text{[Mathematical formula 6]}$$

Mathematical formula 7 is an equation representing the relationship between the reaction current density $i_{loc}$ and the reaction current density $i_{tot}$ per volume. $S_v$ represents a surface area per unit volume, namely, a specific surface area (m²/m³). $S_v$ may be represented by a function of a radius $r_0$ of the active material particle.

$$i_{tot} = S_v i_{loc} \qquad \text{[Mathematical formula 7]}$$

Figure 6:
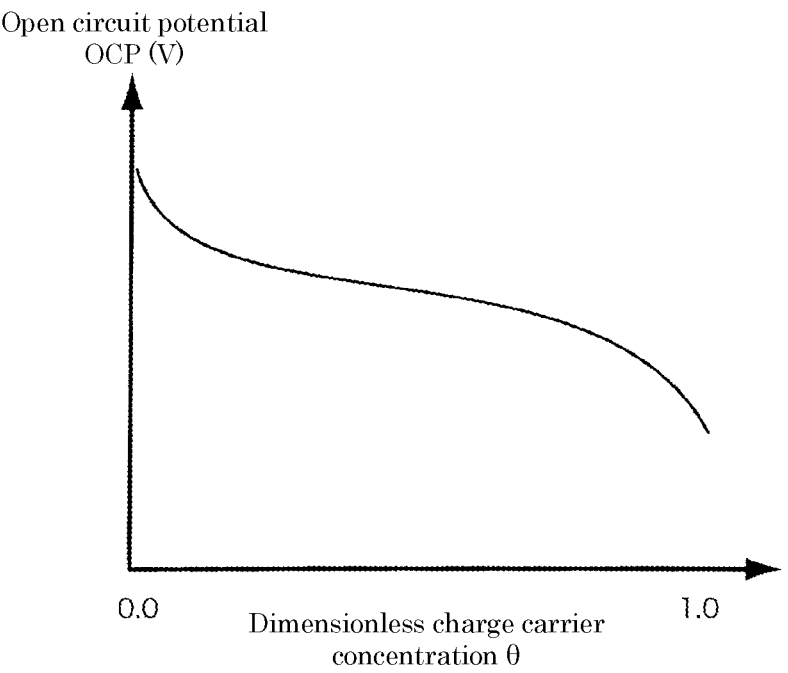
FIG. 6 is a graph illustrating a relationship between a charge carrier concentration in a solid phase and an open circuit potential (OCP) in a typical positive electrode material.

FIG. 6 is a graph illustrating a relationship between the charge carrier concentration in the solid phase and an open circuit potential (OCP) in a typical positive electrode material. A horizontal axis of the graph is a dimensionless charge carrier concentration $\theta$ defined by mathematical formula 8, which is a function of the charge carrier concentration $c_s$. A vertical axis of the graph represents the open circuit potential (OCP).

$$\theta = \frac{c_s - c_{smin}}{c_{smax} - c_{smin}} \qquad \text{[Mathematical formula 8]}$$

Here, $c_{smax}$ is the charge carrier concentration (mol/m³) in the solid phase during the end of discharge (=during the lower limit voltage) at the time of zero cycle when the battery is not degradated at all (for example, at the time of manufacturing the battery). On the other hand, $c_{smin}$ is the charge carrier (mol/m³) in the solid phase during the initial stage of discharge (=during the upper limit voltage or during the time of full charge) at the time of zero cycle when the battery is not degradated at all (for example, at the time of manufacturing the battery). $\theta = 0.0$ because $c_s = c_{smin}$ at the time of full charge, and $\theta = 1.0$ because $c_s = c_{smax}$ at the end of discharge. As the battery is discharged, $\theta$ changes from 0.0 to 1.0 on average. As described above, the open circuit potential OCP of the positive electrode is expressed as the function of the dimensionless charge carrier concentration $\theta$ at the positive electrode. Similarly, the open circuit potential OCP of the negative electrode is expressed as the function of the dimensionless charge carrier concentration $\theta$ at the negative electrode. In the negative electrode, $C_{smax}$ is the charge carrier concentration (mol/m³) in the solid phase during the initial stage of discharge (=during the upper limit voltage or during the time of full charge) at the time of zero cycle when the battery is not degradated at all (for example, at the time of manufacturing the battery). On the other hand, $C_{smin}$ is the charge carrier concentration (mol/m³) in the solid phase during the end of discharge (=during the lower limit voltage) at the time of zero cycle when the battery is not degradated at all (for example, at the time of manufacturing the battery). The controller 11 of the server device 10 individually calculates the OCP of the positive electrode and the OCP of the negative electrode, thereby simulating the degradation due to isolation described later in detail.

Figure 7:
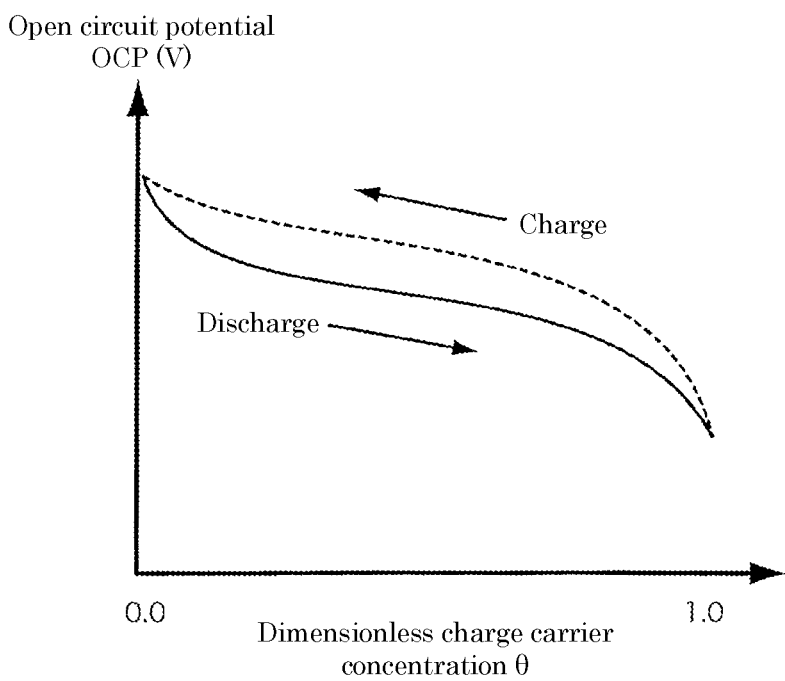
FIG. 7 is a graph illustrating a relationship between a dimensionless charge carrier concentration $\theta$ of an electrode material having high energy density and an open circuit potential OCP.

Alternatively, the controller 11 may use different values of the open circuit potential OCP during the time of discharge and during the time of charge. For example, in an electrode material having high energy density, it has been confirmed that the open circuit potential OCP has hysteresis with respect to the dimensionless charge carrier concentration $\theta$. FIG. 7 is a graph illustrating a relationship between the dimensionless charge carrier concentration $\theta$ of the electrode material having high energy density and the open circuit potential OCP. The horizontal axis of the graph represents the dimensionless charge carrier concentration $\theta$, and the vertical axis represents the open circuit potential OCP. As illustrated in the graph of FIG. 7, even in the same dimensionless charge carrier concentration $\theta$, the value of the open circuit potential OCP is different between the time of charge and the time of discharge. Such properties are referred to as OCP hysteresis or OCP history phenomena and are often observed in the electrode material having the high energy density. When the calculation is performed on the electrode material, the controller 11 can perform the precise simulation using different values of the open circuit potential OCP during the time of discharge and during the time of charge.

In the embodiment, the Newman model is illustrated as an example of the physical model of the lithium ion battery. Alternatively, a single particle model in which the electrode is represented by a single active material particle may be used. For example, a model disclosed in Non-Patent Document "Single-Particle Model for a Lithium-Ion Cell: Thermal Behavior, Meng Guo, Godfrey Sikha, and Ralph E. White, Journal of The Electrochemical Society, 158 (2) 122-132 (2011)" may be referred to as the single particle model. Alternatively, a model other than the physical model such as an equivalent circuit model or a polynomial model may be used as long as the charge-discharge characteristic is expressed. That is, system identification estimating the model from the actually measured input and output data may be used. The system identification may be black box modeling that estimates a model only from the input and output data, or may be gray box modeling that reflects a known system structure to estimate a model based on the input and output data when a part of the system structure is known. For example, a model disclosed in Non-Patent Document "Modeling the Dependence of the Discharge Behavior of a Lithium-Ion Battery on the Environmental Temperature, Ui Seong Kim, a Jaeshin Yi, a Chee Burm Shin, Taeyoung Han,b and Seongyong Park, Journal of The Electrochemical Society, 158 (5) 611-618 (2011)" may be referred to as the polynomial model.

A degradation mechanism of the power storage device will be described below.

An increase in electric resistance in each element constituting the power storage device will be described as a first degradation mechanism. The degradation mechanism due to the increase in electric resistance is a phenomenon in which the internal resistance of the battery increases due to an increase in resistivity of the electrolyte solution or the electron conductive member to decrease the capacity of the battery.

The server device 10 of the embodiment executes the simulation including six types of (positive electrode and negative electrode)×(peeling between current collecting foil and electrode, cutting of conductive path of conductive assistant, formation of resistance film) as factors that increase the electric resistance.

Figure 8:
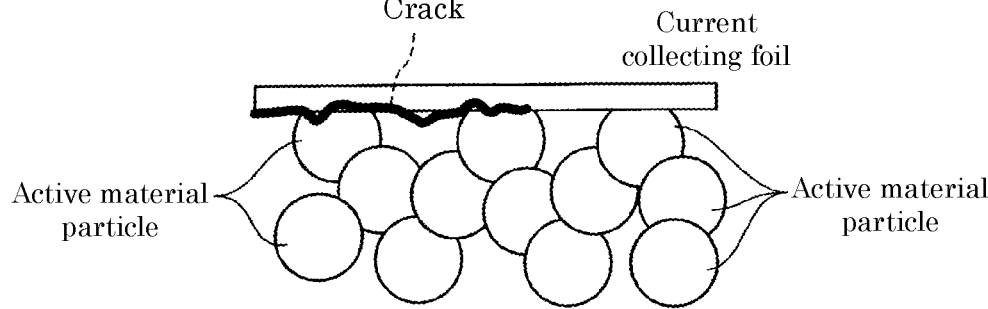
FIG. 8 is an explanatory view illustrating peeling between a current collecting foil and an electrode.

FIG. 8 is an explanatory view illustrating the peeling between the current collecting foil and the electrode. In the power storage device immediately after the start of use, the current collecting foil and the electrode (positive electrode or negative electrode) are in close contact with each other, and the electric resistance between the current collecting foil and the electrode is relatively small. However, because the current collecting foil and the electrode do not have good connectivity, a crack is generated between the current collecting foil and the electrode due to expansion and contraction of particles (active material particle constituting electrode) associated with the charge and discharge, and adhesion is lowered to peel off the current collecting foil and the electrode. As a result, the path through which the current flows decreases, and the electric resistance increases.

Figure 9:
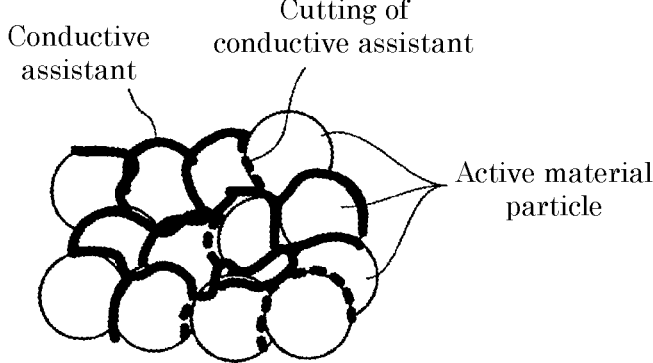
FIG. 9 is an explanatory view illustrating cutting of a conduction path of a conductive assistant.

FIG. 9 is an explanatory view illustrating the cutting of the conduction path of the conductive assistant. Because the electrode material in the power storage device often has poor electron conductivity, conductivity is maintained by adding a small amount of the conductive assistant such as acetylene black. However, because of the expansion and contraction of the particles (active material particles constituting the electrode) associated with the charge and discharge, sometimes the conductive assistant itself may be cut or the contact between the conductive assistant and another conductive assistant, active material particles, or the like may not be maintained. Alternatively, the conductive assistant may disappear due to a chemical reaction. As a result, the path through which the current flows decreases, and the electric resistance increases.

Figure 10:
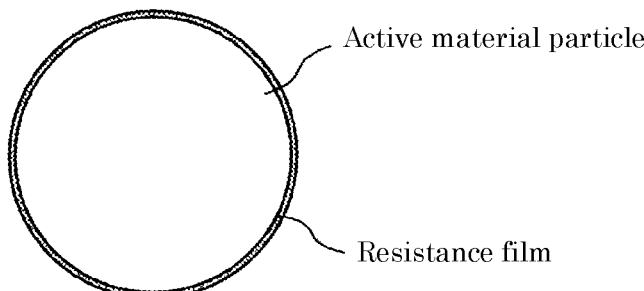
FIG. 10 is an explanatory view illustrating the formation of a resistance film.

FIG. 10 is an explanatory view illustrating formation of the resistance film. A coating film of a resistor is formed on the surface of the active material particle in association with the charge and discharge. For example, in the case of the lithium ion battery, a film made of a compound containing an organic substance in the electrolyte solution and lithium ions is formed. Because the coating film is poor in conductivity, the electric resistance increases.

For example, the controller 11 of the server device 10 calculates the speed at which the electric resistance increases, namely, the speed at which electric conductivity decreases by the following mathematical formula 9 or mathematical formula 10.

$$r_{cycle,res} = -k_{0,res}(N)\exp\left(-\frac{E_{a0,res}}{RT}\right)|i|^{\alpha_{res}} \qquad \text{[Mathematical formula 9]}$$

Here, $r_{cycle,res}$ represents a speed (S/m/cycle number) at which the electric conductivity decreases depending on the cycle number. Typically, $r_{cycle,res}$<0. $k_{0,res}$ is a reaction rate constant, and for example, is a function of the cycle number. $E_{a0,res}$ represents activation energy (J/mol) of the cycle degradation, and is a coefficient representing the influence of temperature. i is a current density (A/m²), and ‖ represents an absolute value. Magnitude of the current density i is a coefficient that is related to the expansion and contraction rate of the electrode and represents a strain rate-dependent breakage phenomenon such as creep. $\alpha_{res}$ is a constant. The values of $k_{0,res}$, $E_{a0,res}$, and $\alpha_{res}$ may be input by the user, or may be previously set in the server device 10. Because the decrease in electric conductivity is often faster as the temperature decreases, it is preferable that $E_{a0,res}$<0.0. In the case where the necessity of the decrease in electric conductivity is eliminated, such as the case where the expansion and contraction of the active material particles is extremely small, the case where the active material particles are composed of only primary particles, the case where the adhesion strength by the binder is extremely high, or the case where the specific resistance of the resistance film is negligibly small, it may be appropriately invalidated by setting $k_{0,res}$=0.0.

$$r_{t,res} = -k_{1,res}(t)\exp\left(-\frac{E_{a1,res}}{RT}\right)\Delta t \qquad \text{[Mathematical formula 10]}$$

Here, $r_{t,res}$ represents a speed (S/m/s) at which the electric conductivity decreases with the elapsed time. Typically, $r_{t,res}$<0. $k_{1,res}$ is a reaction rate constant, and for example, is a function of time. Alternatively, $k_{1,res}$ may be defined by any function based on experimental data. $E_{a1,res}$ represents the activation energy (J/mol) of the time degradation, and is a coefficient representing the influence of temperature. At is the elapsed time (s). The values of $k_{1,res}$ and $E_{a1,res}$ may be input by the user or may be preset in the server device 10.

When the conductivity at the time of N cycles is $\sigma_s(N)$, $\sigma_s(N+1)$ is expressed by an equation of mathematical formula 11 obtained by adding the cycle degradation rate and the time degradation rate of one cycle to $\sigma_s(N)$. When attention is paid to $r_{cycle,res}$<0 and $r_{t,res}$<0, $\sigma_s(N+1)$<$\sigma_s(N)$ is typically satisfied, and the conductivity decreases as the cycle number increases or time elapses.

$$\sigma_s(N+1)=\sigma_s(N)+r_{cycle,res}+r_{t,res} \qquad \text{[Mathematical formula 11]}$$

In the embodiment, the configuration in which the rate at which the electric conductivity decreases is calculated by mathematical formula 9 and mathematical formula 10 has been described. However, the arithmetic expression is merely an example, and may be freely modified based on an experimental result, a document data, and the like.

In the embodiment, the configuration in which the rate at which the electric conductivity decreases is calculated as the function of the cycle number or the elapsed time has been described. Alternatively, the controller 11 may calculate the speed at which the electric resistance increases using mathematical formula 12 as a function of the upper limit and the lower limit of the SOC. At this point, the upper limit and the lower limit of the SOC represent the upper limit and the lower limit in the use range of the battery.

$$r_{cycle,res} = -k_{0,res}(N)\exp\left(-\frac{E_{a0,res}}{RT}\right)$$ [Mathematical formula 12]

$$|i|^{\alpha_{res}}f(SOC_{max}, SOC_{min})$$

It is said that the progress of the degradation such as the increase in electric resistance is caused by stress due to the expansion and contraction by the charge and discharge. It is known that the magnitude of the expansion and contraction is related to the use range of the SOC, and particularly it is known that the expansion and contraction are increased using up to the lower limit of the SOC. Accordingly, the degradation rate may be given as the function of the upper limit and the lower limit of the SOC. Because the expansion and contraction is not generated without energization, it is often sufficient to consider only the cycle degradation. The controller 11 can calculate the speed at which the electric resistance increases depending on the cycle number by mathematical formula 12 obtained by multiplying the function that takes an upper limit $SOC_{max}$ and a lower limit $SOC_{min}$ of the SOC as arguments as factors. The values of the upper limit $SOC_{max}$ and the lower limit $SOC_{min}$ may be input by the user, or may be previously set in the server device 10. In many cases, because it is known that the rate of the increase in electric resistance increases as the value of $(SOC_{max}-SOC_{min})$ increases, it is preferable to use the function in which the reaction rate increases as the value of $(SOC_{max}-SOC_{min})$ increases.

Although the parameters $k_{0,res}$, $E_{a0,res}$, $\alpha_{res}$, $k_{1,res}$, $E_{a1,res}$, $SOC_{max}$, and $SOC_{min}$ are used in a rate equation determining the increase in electric resistance, different values may be used for the positive electrode and the negative electrode with respect to peeling between the current collecting foil and the electrode, the cutting of the conduction path of the conductive assistant, and the formation of the resistance film. Alternatively, some or all of these values may be set to the same value as necessary. These values may be different between the charge process and the discharge process.

Isolation of the active material particle will be described as a second degradation mechanism. The degradation mechanism due to the isolation of the active material particle is a phenomenon in which the active material particle is broken by the repeated expansion and contraction due to the charge and discharge, a region where charge carriers cannot be inserted and removed gradually increases, a portion where charge carriers can be occluded and extracted in the active material particle decreases, and the amount of electricity that can be stored, namely, the battery capacity decreases. The occlusion is a phenomenon in which the charge carrier is retained in the solid phase, namely, in the active material particle. The release is a phenomenon in which the charge carriers are discharged to the outside of the active material particles.

The controller 11 of the server device 10 calculates the speed at which the isolation of the active material particles progresses by mathematical formula 13 or mathematical formula 14.

$$r_{cycle,iso} = -k_{0,iso}(N)\exp\left(-\frac{E_{a0,iso}}{RT}\right)|i|^{\alpha_{iso}}$$ [Mathematical formula 13]

Here, $r_{cycle,iso}$ represents the speed (1/cycle number) at which the isolation of the active material particles progresses depending on the cycle number. Typically, $r_{cycle,iso}<0$. $k_{0,iso}$ is a reaction rate constant, for example, is a function of the cycle number. $E_{a0,iso}$ represents activation energy (J/mol) of the cycle degradation, and is a coefficient representing the influence of temperature. i is the current density (A/m²). Magnitude of the current density i is a coefficient that is related to the expansion and contraction speed of the electrode and represents a strain rate-dependent fracture phenomenon such as creep and crack development. $\alpha_{iso}$ is a constant. The values of $k_{0,iso}$, $E_{a0,iso}$, and $\alpha_{iso}$ may be input by the user, or may be preset in the server device 10.

$$r_{t,iso} = -k_{1,iso}(N)\exp\left(-\frac{E_{a1,iso}}{RT}\right)\Delta t$$ [Mathematical formula 14]

Here, $r_{t,iso}$ represent (1/s) that is the speed at which the isolation of the active material particles progresses depending on the elapsed time. Typically, $r_{t,iso}<0$. $k_{1,iso}$ is a reaction rate constant, for example, is a function of time. Alternatively, $k_{1,iso}$ may be defined by any function based on experimental data. $E_{a1,iso}$ represents the activation energy (J/mol) of the time degradation, and is a coefficient representing the influence of temperature. $\Delta t$ is the elapsed time (s). For the low stress inside the battery, the isolation is less likely to proceed only with the lapse of time, but the isolation is hardly ignored when the battery is in the high stress state due to strong external restraint. The values of $k_{1,iso}$ and $E_{a1,iso}$ may be input by the user, or may be previously set in the server device 10.

When the solid phase volume ratio of the active material particle at the time of N cycles is represented by $\varepsilon_s(N)$, $\varepsilon_s(N+1)$ is expressed by an equation of mathematical formula 15 obtained by adding a cycle degradation rate and a time degradation rate of one cycle to $\varepsilon_s(N)$.

$$\varepsilon_s(N+1)=\varepsilon_s(N)+r_{cycle,iso}+r_{t,iso}$$ [Mathematical formula 15]

At this point, the reason why the power storage device degrades when the solid phase volume ratio $\varepsilon_s$ of the active material particle decreases, namely, the number of sites where the charge carrier can be occluded in the power storage device decreases, and the amount of electricity that can be stored, namely, the electric capacity decreases will be described.

The decrease in electric capacity will be described using a minimum concentration $c_{smin}$ and a maximum concentration $c_{smax}$ of the occluded charge carrier. For the positive electrode, the maximum concentration is reached at the end of discharge, and the minimum concentration is reached at the time of full charge. The volume necessary for calculating these charge carrier concentrations is the volume of the phase in which the occluded charge carrier can exist. When the apparent volume (for example, coating area×coating thickness) of the electrode is denoted by $V_{app}$ (m³), and when the solid phase volume ratio of the active material particle in the electrode at the time of manufacturing is denoted by $\varepsilon_{s0}$, the volume of the phase in which the occluded charge carrier can exist is $V_{app}\varepsilon_{s0}$. When the battery capacity at the time of manufacturing is $Q_0$ (C or Ah), mathematical formula 16 holds.

$$Q_0=zFV_{app}\varepsilon_{s0}(c_{smax}-c_{smin})$$ [Mathematical formula 16]

When the battery degrades and the isolation of the electrode progresses, the solid phase volume ratio $\varepsilon_s$ of the active material particle contributing to the power storage is lower than $\varepsilon_{s0}$. When the battery capacity in the case where the solid phase volume ratio of the active material particle becomes $\varepsilon_s$ is denoted by Q, mathematical formula 17 holds.

$$Q=zFV_{app}\varepsilon_s(c_{smax}-c_{smin}) \qquad \text{[Mathematical formula 17]}$$

Unnecessary characters are deleted from mathematical formula 16 and mathematical formula 17 to obtain mathematical formula 18.

$$\frac{Q}{\varepsilon_s} = \frac{Q_0}{\varepsilon_{s0}} \qquad \text{[Mathematical formula 18]}$$

That is, it is illustrated that Q becomes smaller than $Q_0$ when es becomes smaller than $\varepsilon_{s0}$. This is the reason why the battery capacity decreases due to the isolation.

In the embodiment, the configuration in which the speed at which the isolation of the active material particle progresses is calculated by mathematical formula 13 and mathematical formula 14 has been described. However, the arithmetic expression is merely an example and may be freely modified based on the experimental result, the document data, and the like.

In the embodiment, the configuration in which the speed at which the isolation of the active material particle progresses is calculated as the function of the cycle number or the elapsed time has been described. Alternatively or additionally, the controller 11 may calculate the speed at which the isolation of the active material particle progresses using an equation similar to mathematical formula 12 in which the function of the upper limit and the lower limit of the SOC in generating the switching of the energization direction is used as factors. The values of the upper limit $SOC_{max}$ and the lower limit $SOC_{min}$ may be input by the user, or may be previously set in the server device 10. In many cases, because it is known that a progress rate of the isolation increases as the value of ($SOC_{max}-SOC_{min}$) increases, it is preferable to use the function in which the reaction rate increases as ($SOC_{max}\cdot SOC_{min}$) increases. The total amount of energized electricity may be used instead of the cycle number.

$$r_{cycle,iso} = -k_{0,iso}(N)\exp\left(-\frac{E_{a0,iso}}{RT}\right) \qquad \text{[Mathematical formula 19]}$$
$$|i|^{\alpha_{iso}} f(SOC_{max}, SOC_{min})$$

Although the parameters $k_{0,iso}$, $E_{a0,iso}$, $\alpha_{iso}$, $k_{1,iso}$, $E_{a1,iso}$, $SOC_{max}$, and $SOC_{min}$ are used in the rate equation determining the progress of the isolation, desirably different values are used in the positive electrode and the negative electrode. Accordingly, among the causes of the isolation in the entire battery, the contribution of the positive electrode and the contribution of the negative electrode can be separately simulated. When the necessity of the isolation is not considered, such as the case where the expansion and contraction of the active material particle is extremely small and the case where the active material particle is composed of only the primary particle, the active material particle may be appropriately invalidated, for example, by setting $k_{0,iso}=0.0$. The above values may be different between the charge process and the discharge process.

The decrease in conductivity in the electrolyte solution will be described as a third degradation mechanism. The degradation mechanism due to the decrease in conductivity in the electrolyte solution is a phenomenon in which the resistivity of the electrolyte solution increases, the internal resistance of the battery increases, and the capacity decreases due to the decrease in conductivity by the disappearance of the charge carrier, the decrease in conductivity due to the generation of minute bubbles in the electrode assembly, the change in molecular structure of a solvation, clogging of a separator, and the like. The carrier disappearance of the charge is mainly generated when the resistance film is formed on the surface of the active material particle.

Figure 11:
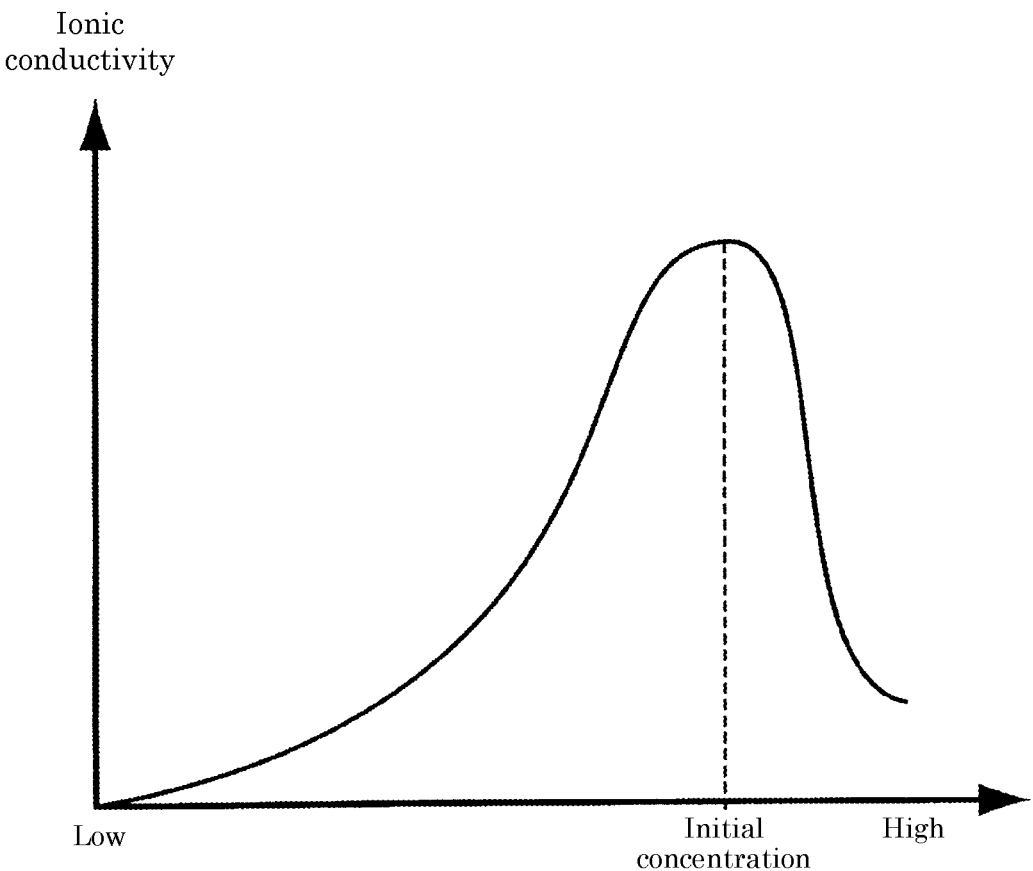
FIG. 11 is a graph illustrating a relationship between a lithium-ion concentration in an electrolyte solution and ionic conductivity.

It is known that the lithium ion in the electrolyte solution decrease when the charge and discharge are repeated. The conductivity of the electrolyte solution is a function of the lithium ion concentration, and is generally maximum at the time of initial production, but is known to decrease as the lithium ion concentration decreases. FIG. 11 is a graph illustrating a relationship between the lithium ion concentration in the electrolyte solution and the ionic conductivity. In the graph of FIG. 11, the horizontal axis represents the lithium ion concentration in the electrolyte solution, and the vertical axis represents the ionic conductivity. The relationship between the lithium ion concentration in the electrolyte solution and the ionic conductivity often becomes the relationship in FIG. 11. The controller 11 of the server device 10 can calculate a decrease rate of the conductivity by the same function as mathematical formula 5 and mathematical formula 6. Alternatively, the controller 11 may calculate the decrease rate of the conductivity using the same equation as mathematical formula 8 in which functions of the upper limit and the lower limit of the SOC are used as factors. Alternatively, not only the conductivity of the ion but also the diffusion coefficient may be changed.

The cause of the decrease in the lithium ion concentration of the electrolyte solution is considered to be precipitation of an electrolyte salt as an insoluble matter due to a very small amount of a product of an oxidation reaction of the electrolyte solution at the positive electrode. As a result, the reaction of trapping the lithium ions more than the number of electrons consumed by the reductive decomposition of the electrolyte solution in the negative electrode is generated. As the reaction proceeds, the lithium ion concentration in the electrolyte solution gradually decreases, leading to the decrease in conductivity.

As a fourth degradation mechanism, a decrease in charge carrier involved in the charge and discharge will be described. The degradation mechanism due to the decrease in charge carriers is a phenomenon in which ions in the electrolyte solution disappear due to a side reaction on the surface of the electrode during the charge.

For example, for the lithium ion battery, when the lithium ions in the electrolyte solution enter graphite (that is, at the time of charge), the side reaction in which $LiC_6$ reacts with an organic substance or the like to adhere to the surface of electrode active material particle as the resistance film is generated in addition to a main reaction ($Li^++e^-+6C \rightarrow LiC_6$). The main reaction is a reversible reaction, and the reaction of $Li \rightarrow Li^++e^-$ is generated when the voltage is reversely applied, but the side reaction is irreversible. That is, the lithium ion once formed into the resistance film cannot participate in the charge and discharge thereafter, and the capacity decreases. This mechanism is referred to as a decrease in charge carrier (or capacity balance deviation) involved in the charge and discharge. The fourth degradation mechanism is caused by the decrease in the lithium ion concentration of the electrolyte solution, but the electrode material is not degraded. That is, there is room for reuse of the fourth degradation mechanism after disassembly cleaning.

The fourth degradation mechanism is known to be accelerated by both time and cycling for the lithium ion battery. During the charge, as represented by the reaction formula of $Li^+ + e^- 6C + P \rightarrow xLiC_6 + (1-x)Li_{SEI}$, a byproduct of $Li_{SEI}$ is generated in addition to the main reaction in which Li is generated (ideally x=1). P is a substance as a base of the byproduct. At this point, x:(1−x) is a stoichiometric ratio of main reaction side reaction. Usually because of (1−x)/x≪1, the stoichiometric coefficient of the side reaction is very small. The lithium ion obtained by multiplying the stoichiometric coefficient of the side reaction by the current density and the surface area of the electrode and dividing the product by the Faraday constant disappears from the electrolyte solution. In order to express the mechanism, assuming that the lost amount of $Li^+$ in the liquid phase is $J_{Li+}$ (mol/m²s), the amount of Li flowing into the solid phase $J_b$ (mol/m²s) may be $J_{Li} = x J_{Li+}$.

x may be a function of the upper limit $SOC_{max}$ and the lower limit $SOC_{min}$, the temperature T, and the current density i as appropriate. For example, a function as described in mathematical formula 20 may be used. h is any function defined to fit experimental data. Note that 0.0≤x≤1.0.

$$x = h(SOC_{max}, SOC_{min}, T, |i|) \qquad \text{[Mathematical formula 20]}$$

The side reaction is generated not only at the time of charge but also without energization, but it is preferable to give a disappearance rate $r_{Li}$ of the lithium ion as a function of time ($r_{Li} = g(t)$) based on the measured data. As the function g, a function proportional to the square root of the time t is often used. The function g may further include a factor related to temperature.

The decrease in charge carrier involved in the charge and discharge in the fourth degradation mechanism is related to the formation of the resistance film in the first degradation mechanism and the decrease in conductivity in the electrolyte solution in the third degradation mechanism. That is, in both the cases, the lithium ion in the electrolyte solution is not used due to the irreversible reaction, and is deposited on the electrode surface. In the simulation of the present application, these phenomena that have been conventionally separately handled can be calculated in association with each other.

For example, when the thickness of the resistance film is 6 (m) and the mass density is $\rho_{film}$ (kg/m³), mathematical formula 21 is obtained. M is the molecular weight (kg/mol) of the coating material.

$$\frac{d\delta}{dt} = (1-x)J_{Li+}\frac{M}{\rho_{film}} \qquad \text{[Mathematical formula 21]}$$

The formula illustrated in mathematical formula 22 represents the total amount (mol) of the lithium ion that disappears from the electrolyte solution due to film formation over the electrode active material particle surface area S (m²) until the time t (s). Growth of the resistance film, the decrease in conductivity in the electrolyte solution, and the decrease in charge carrier can be calculated in association with each other by combining mathematical formula 22 with the decrease in the concentration of the lithium ion in the electrolyte solution described in the third degradation mechanism.

$$\int_0^t \int \int (1-x)J_{Li+}\,dS \qquad \text{[Mathematical formula 22]}$$

The ohmic overvoltage generated in the resistance film is expressed as mathematical formula 23. Where, $r_{film}$ is the resistivity ($\Omega m^2$) of the resistance film.

$$\eta_{film} = r_{film}\delta i_{loc} \qquad \text{[Mathematical formula 23]}$$

Operation of the server device 10 and the client device 20 will be described below.

Figure 12:
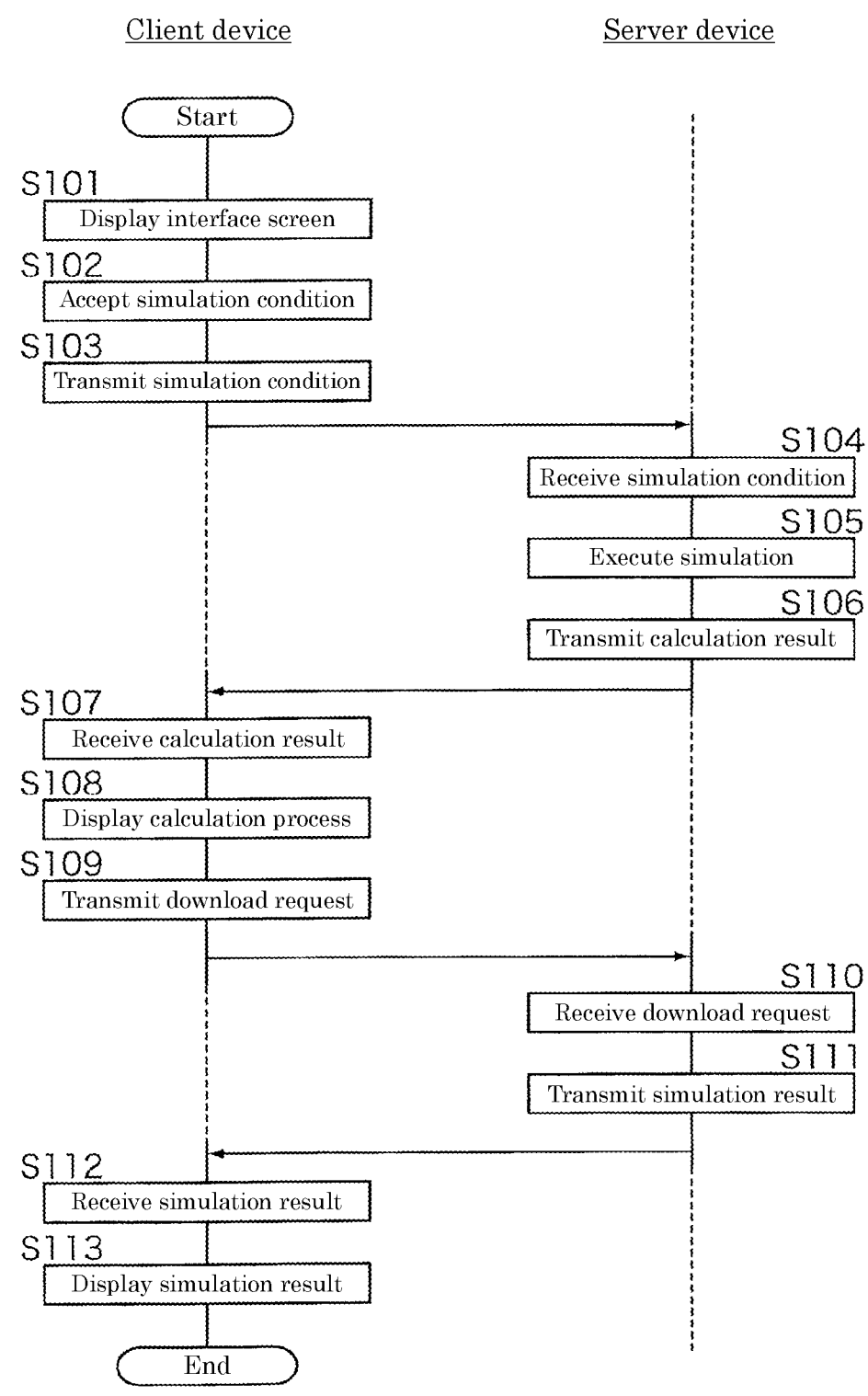
FIG. 12 is a flowchart illustrating a procedure of processing executed by the server device and the client device.

FIG. 12 is a flowchart illustrating a procedure of processing executed by the server device 10 and the client device 20. The controller 21 of the client device 20 receives the display screen data transmitted from the server device 10 after the user authentication, and displays the interface screen 100 on the display 25 (step S101). The controller 21 accepts the simulation condition through the interface screen 100 displayed on the display 25 (step S102). For example, the interface screen 100 receives selection of the cycle degradation or the time degradation, selection of the degradation mechanism, and input of battery information.

The controller 21 transmits the simulation condition accepted through the interface screen 100 to the server device 10 through the communication unit 23 (step S103).

In the server device 10, the simulation condition transmitted from the client device 20 is received by the communication unit 13 (step S104).

The controller 11 of the server device 10 executes the simulation based on the simulation condition received through the communication unit 13 (step S105). At this point, the controller 11 selects a simulation program corresponding to the simulation condition, and simulates the degradation of the power storage device by applying the simulation condition to the selected simulation program. The controller 11 may store the simulation condition received in step S104 in the storage 12 in association with the user ID input at the time of user authentication. When the simulation is executed, the controller 11 transmits the calculation result to the client device 20 through the communication unit 13 (step S106). In step S106, the calculation result may be transmitted to the client device 20 whenever a value to be calculated (electric resistance for each component, volume ratio of isolated region, diffusion coefficient or ionic conductivity of electrolyte solution, expansion coefficient of battery, and the like) in a certain time step or a certain cycle is obtained.

The client device 20 receives the calculation result transmitted from the server device 10 by the communication unit 23 (step S107). The controller 21 of the client device 20 displays the received calculation result on the display field 130 of the interface screen 100 as a calculation process during the simulation (step S108). The user can grasp whether the simulation by the server device 10 is completed by referring to the calculation process displayed on the display field 130.

Subsequently, when the download button 131 is operated on the interface screen 100, the controller 21 transmits a simulation result download request to the server device 10 through the communication unit 23 (step S109).

When receiving the download request from the client device 20 (step S110), the server device 10 transmits the simulation result to the client device 20 (step S111). The simulation result transmitted by the server device 10 in step S111 is data indicating how the value of the electric resistance for each component, the volume ratio of the isolated region, the diffusion coefficient or the ionic conductivity of the electrolyte solution, the decreased charge carrier amount, the expansion coefficient of the battery compared to the initial state, and the like change with the elapsed time and the cycle number. The simulation result may be numerical data of three columns of the elapsed time, the cycle number, and the physical value. Alternatively, the simulation result may be a graph, a contour diagram, or a moving image generated from the numerical data. Alternatively, the simulation result may be in a form of a library according to a form of commercial simulation software. Alternatively, the simulation result may include a simulation program for degradation simulation including electrochemical. A file format to be downloaded may be desirably selected by the user according to numerical analysis software or a program language used by the user.

The client device 20 receives the simulation result transmitted from the server device 10 by the communication unit 23 (step S112). The controller 21 of the client device 20 causes the display 25 to display the received simulation result (step S113). When the value of the electric resistance for each component and the diffusion coefficient or the ionic conductivity of the electrolyte solution are known, a calorific value at the time of the energization can be calculated, so that the client can perform, for example, temperature simulation. Accordingly, cooling design and thermal management design can be performed. When the volume ratio of the isolated region and the decreased charge carrier amount are known, the degradation of the electrode material is known, so that the client can perform, for example, a life cycle prediction and a prediction of the reuse rate. When the expansion coefficient of the battery is known as compared to the initial state, the client can design the strength of, for example, a module case or a battery can housing.

The expansion of the battery associated with the degradation includes expansion due to gas generation inside the battery, volume expansion due to a crack of the electrode, and the expansion and contraction of the electrode associated with the charge and discharge. Among others, the expansion due to the gas generation and the volume expansion due to the crack of the electrode are the irreversible expansion and contraction such that the volume becomes larger than the original volume by one charge and discharge. On the other hand, the expansion and contraction of the electrode associated with the charge and discharge is the reversible expansion and contraction that returns to the original volume after one charge and discharge.

For example, mathematical formula 24 to mathematical formula 26 can be considered as the expression representing the expansion.

$$\alpha_{gas} = k_0(T) \qquad \text{[Mathematical formula 24]}$$

Here, $\alpha_{gas}$ is a linear expansion coefficient with respect to the original volume due to the gas generation. Mathematical formula 24 is an equation representing the expansion due to the gas generation as a function of temperature T. That is, because vapor pressure increases as the temperature increases, evaporation of the electrolyte solution and extraction of the gas from the electrode is easily generated.

$$\alpha_{crack} = f(\varepsilon_{s0} - \varepsilon_s) \qquad \text{[Mathematical formula 25]}$$

Here, $\alpha_{crack}$ is a linear expansion coefficient with respect to the original volume due to the electrode crack, $\varepsilon_{s0}$ is an effective active material particle volume ratio of the electrode during the manufacturing, and $\varepsilon_s$ is an effective active material particle volume ratio of the electrode at an arbitrary time point. The effective active material particle volume ratio is a volume ratio of a non-isolated portion in the volume of the solid portion of the electrode. When the active material particle cracks to decrease the effective active material particle volume ratio $\varepsilon_s$, $(\varepsilon_{s0} \cdot \varepsilon_s)$ increases. Mathematical formula 25 is an expression representing the expansion due to the electrode crack as a function of $(\varepsilon_{s0} - \varepsilon_s)$ representing the amount of the electrode crack.

$$\alpha = g(\alpha_{gas}, \alpha_{crack}) \qquad \text{[Mathematical formula 26]}$$

Mathematical formula 26 represents a total linear expansion coefficient, and is a function using the expansion due to the gas generation and the expansion due to the electrode crack as arguments.

Because the expansion equation can be appropriately changed according to the battery type or the battery material, the expansion equation is not limited to mathematical formula 24 to mathematical formula 26.

Figure 13:
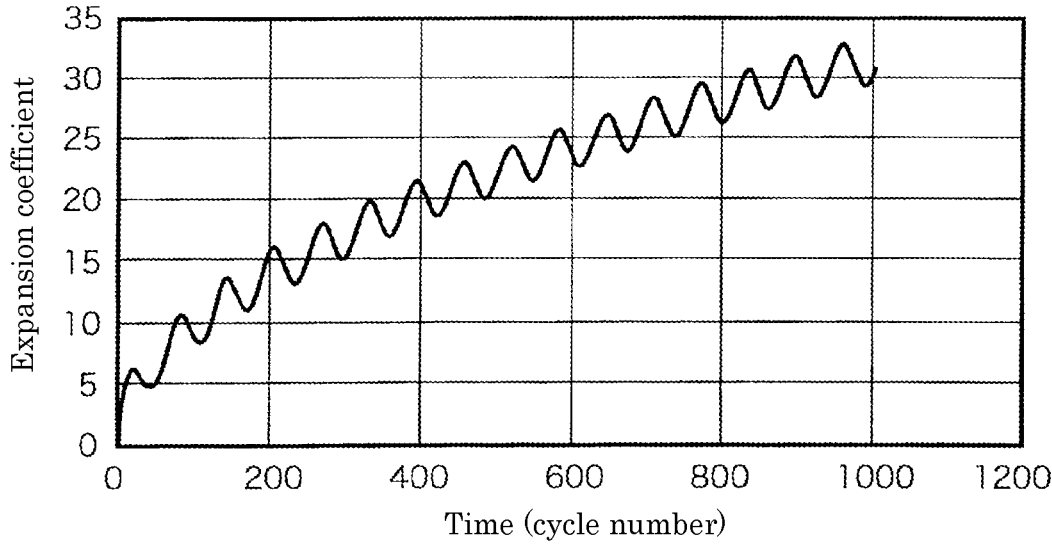
FIG. 13 is a graph illustrating a temporal change in expansion coefficient.

FIG. 13 is a graph illustrating a temporal change in expansion coefficient. The horizontal axis of the graph in FIG. 13 represents the time (or the cycle number), and the vertical axis represents the expansion coefficient. As illustrated in the graph of FIG. 13, the expansion coefficient of the battery is a sum of a component that monotonically increases while decreasing and a component that expands and contracts with the charge and discharge. The former is irreversible (plastic) expansion, and the latter is reversible (elastic) expansion. The irreversible expansion is given so as to increase as the function of the elapsed time or the cycle number, and the relationship between the expansion coefficient and the elapsed time or the cycle number may be obtained by an experiment. When the expansion coefficient is simply performed without directly using the experimental data, the expansion coefficient can also be defined by geometrical progression using the elapsed time or the cycle number as arguments. For example, when the increase in the expansion coefficient in one cycle is r (typically 0<r<1), the expansion coefficient after N cycles is represented by mathematical formula 27 with $\alpha_0$ as a constant.

$$\alpha_0\{1 + r + r^2 + \cdots + r^N\} = \frac{\alpha_0(1 - r^{N+1})}{1 - r} \qquad \text{[Mathematical formula 27]}$$

The degradation simulation model may include a stress-strain model and a fatigue model. It is known that many of the electrode materials change in volume with the charge and discharge. In particular, in the electrode material of the lithium ion battery, the volume change associated with removal and insertion of lithium of the charge carrier is conspicuous. Normally, because the battery is restrained by a resin material, a metal material, high-tensile-strength steel, or the like, a large internal stress is generated when the electrode material expands, and a minute crack (fissure) may be generated in the active material particle. The crack causes the isolation of the active material particle described above. For this reason, design that does not increase the stress in the active material particle is desired.

Accordingly, when the structure simulation is performed, by adding the strain as the function of the charge carrier concentration in the active material particle to the stress-strain relational expression, the stress-strain due to the expansion and contraction of the electrode can be calculated in consideration of the charge and discharge. The functional form of the charge carrier concentration and the strain may be proportional or any other function.

For example, the portion calculating the electrochemistry of the model may be connected to an electric network of numerical analysis software, and the portion calculating the stress-strain may be connected to commercially available numerical analysis software (such as finite element method structural analysis simulation software). Thus, the degradation of the battery and the stress-strain can be calculated while connected simultaneously to each other.

The degradation simulation model may include a heat transfer model. The battery in which the degradation progresses, particularly the battery in which the increase in electric resistance or the decrease in conductivity in the electrolyte solution progresses tends to have the large calorific value. In general, the higher the temperature, the faster the progress of the degradation, and temperature management is also an important factor suppressing the degradation of the battery.

The calorific value can be calculated by the following equation.

$$\text{(calorific value)}=\text{(current)}\times\text{(ohmic overvoltage+activation overvoltage)}=\text{(current)}\times\text{(open circuit voltage between terminals-voltage between terminals)}$$

For example, the portion calculating the electrochemistry of the model may be connected to the electric network of the numerical analysis software, and the portion calculating the heat may be connected to the thermal network calculation portion of the commercially available numerical analysis software. Thus, the calculation can be performed while the degradation of the battery and the heat generation are simultaneously connected to each other.

As described above, in the embodiment, the degradation of the power storage device can be simulated in consideration of the degradation mechanism, and the simulation result can be provided to the user. Because the mathematical model obtained as a result of simulating the degradation of the power storage device can be provided to the user as necessary, the client device 20 can acquire the simulation result of the power storage device or the system including the power storage device under the desired condition using the mathematical model downloaded from the server device 10. The client device 20 may download the simulation program used for calculating the simulation result from the server device 10.

In using the simulation program downloaded to the client device 20, the client device 20 may be required for communicating with the server device 10 and receiving the user authentication. At this point, the simulation condition input to the client device 20 may be transmitted to the server device 10.

The disclosed embodiment is illustrative in all respects and not restrictive. The scope of the present invention is illustrated by the scope of the claims, and includes all changes within the scope of the claims and meaning equivalent to the scope of the claims.

For example, in the present embodiment, the wound type lithium ion battery in which the electrolyte is the liquid is taken as an example. Alternatively, the simulation method of the present application can be applied to battery types such as an all-solid-state lithium ion battery, a bipolar lithium ion battery (electrode connected in electric series), a zinc-air battery, a sodium ion battery, and a lead-acid battery.

In the specification, the embodiment in which the simulation is performed by the communication between the server device 10 and the client device 20 has been exemplified. Alternatively, the server administrator may provide the simulation program to the client user by means of the storage medium such as a DVD-ROM, and the simulation may be locally performed in the client terminal. The provision means may be the download form through the communication. That is, when the controller 21 of the client device 20 executes the simulation program, the client device 20 is configured to function as the development support device of the present application that receives the selection information regarding the degradation mechanism of the power storage device, executes the degradation simulation of the power storage device using the selected degradation mechanism, and outputs the simulation result.

DESCRIPTION OF REFERENCE SIGNS

10: server device
11: controller
12: storage
13: communication unit
14: operation unit
15: display
20: client device
21: controller
22: storage
23: communication unit
24: operation unit
25: display
N: communication network

The invention claimed is:

1. An information processing device comprising:
a storage that stores a simulation program which is a computer program; and a processor configured to:
after user authentication, transmit information to a terminal device, which is communicably connected to the information processing device via a communication network, an interface screen being configured to receive inputs, by a user of the terminal device, of a selection information about a degradation mechanism of a power storage device;
present a plurality of options regarding the degradation mechanism via the interface screen, wherein the selection information includes the user selects two of the plurality of options which include a cycle degradation or time degradation and at least one of degradation mechanisms includes an increase in electric resistance in each element constituting the power storage device, isolation of an active material particle, a decrease in conductivity in an electrolyte solution, and a decrease in charge carrier involved in charge and discharge;
receive via the interface screen the selection information;
select the simulation program corresponding to the received selection information;
simulate the degradation of the power storage device in response to the user selection by executing the selected simulation program; and
transmit a simulation result of the power storage device to the terminal device for user evaluation.

2. The information processing device according to claim 1, wherein the simulation uses a physical model representing the power storage device.

3. The information processing device according to claim 1, wherein the increase in electric resistance includes an increase in electric resistance at an adhesion portion between current collecting foil and a porous electrode, an increase in electric resistance associated with a decrease in conductive path in the active material particles, or an increase in electric resistance associated with an increase in resistance film on a particle surface.

4. The information processing device according to claim 1, wherein the increase in the electric resistance, the isolation of the active material particle, and the decrease in conductivity are represented by a function of an upper limit and a lower limit of a state of charge of the power storage device during discharge.

5. The information processing device according to claim 1, wherein the increase in electric resistance, the isolation of the active material particle, the decrease in conductivity, and the decrease in charge carrier are represented by a function of at least one of elapsed time, a cycle number, and a temperature.

6. The information processing device according to claim 1, wherein the decrease in charge carrier is represented by a stoichiometric coefficient of a charge transfer process on a surface of a negative electrode during charge, wherein the interface screen transmitted to the terminal device for display receives input of the selection information about a degradation mechanism of the power storage device by the user.

7. The information processing device according to claim 1, wherein the simulation result includes a time change or a cycle change of any one of a value of electric resistance, a volume ratio of an isolated region of the active material particle, a diffusion coefficient or ionic conductivity of the electrolyte solution, a charge carrier amount, and an expansion coefficient of the power storage device in each element constituting the power storage device, wherein the simulation of the degradation of the power storage device is by executing the selected simulation program by the user.

8. The information processing device according to claim 1, wherein the selection information is received according to a selection from a user interface in the terminal device.

9. The information processing device according to claim 1, wherein the selection information about the degradation mechanism of the power storage device is received by a receiver circuit through a communication network, wherein the terminal device receives the simulation result from a transmitter circuit through the communication network, and wherein the simulation program simulates degradation of the power storage device according to the selected degradation mechanism.

10. An information processing device comprising:

a storage that stores a simulation program which is a computer program; and a processor configured to:

receive selection information about a degradation mechanism of a power storage device;

transmit information to a terminal device, which is communicably connected to the information processing device via a communication network, an interface screen being configured to receive inputs, by a user of the terminal device, of a selection information about a degradation mechanism of the power storage device;

present a plurality of options regarding the degradation mechanism via the interface screen, wherein the selection information includes the user selects two of the plurality of options which include a cycle degradation or time degradation and at least one of degradation mechanisms includes an increase in electric resistance in each element constituting the power storage device, isolation of an active material particle, a decrease in conductivity in an electrolyte solution, and a decrease in charge carrier involved in charge and discharge;

select the simulation program corresponding to the degradation mechanism based on the received selection information;

simulate a degradation of the power storage device by executing the selected degradation mechanism; and output a simulation result or the simulation program executed when the degradation of the power storage device is simulated.

11. The information processing device according to claim 10, wherein the selection information is received according to a selection from a user interface in the terminal device.

12. The information processing device according to claim 10, wherein the selection information about the degradation mechanism of the power storage device is received by a reception circuit through a communication network, wherein the terminal device receives the simulation result from output circuit through the communication network, and wherein the simulation program simulates degradation of the power storage device according to the selected degradation mechanism.

13. A computer-implemented information processing method comprising:

transmitting, by a processor, information to a terminal device which is communicably connected to the information processing device via a communication network, an interface screen being configured to present a plurality of options regarding a degradation mechanism of a power storage device;

receive via the interface screen a selected degradation mechanism;

present a plurality of options regarding the degradation mechanism via the interface screen, wherein the selection information includes the user selects two of the plurality of options which include a cycle degradation or time degradation and at least one of degradation mechanisms includes an increase in electric resistance in each element constituting the power storage device, isolation of an active material particle, a decrease in conductivity in an electrolyte solution, and a decrease in charge carrier involved in charge and discharge;

select a simulation program corresponding to the selected degradation mechanism;

simulate a degradation of the power storage device by executing the selected simulation program; and transmit a simulation result or the simulation program executed in simulating the degradation of the power storage device to the terminal device.

14. A non-transitory computer readable medium comprising a computer program comprising the computer-implemented information processing method according to claim 13.

15. The computer-implemented information processing method according to claim 13, wherein the selection information is received according to a selection from a user interface in the terminal device.

16. The computer-implemented information processing method according to claim 13, wherein the selection information about the degradation mechanism of the power storage device is received through a communication network, wherein the terminal device receives the simulation result through the communication network, and wherein the simulation program simulates degradation of the power storage device according to the selected degradation mechanism.

17. A non-transitory computer readable medium comprising a computer program comprising the computer-implemented information processing method according to claim

13, wherein the selection information is received according to a selection from a user interface in the terminal device.

18. The computer-implemented information processing method according to claim 13, wherein the selection information about the degradation mechanism of the power storage device is received through a communication network, wherein the terminal device receives the simulation result through the communication network, and wherein the simulation program simulates degradation of the power storage device according to the selected degradation mechanism.

\* \* \* \* \*